(12) United States Patent
Kinstle, III

(10) Patent No.: US 9,622,386 B2
(45) Date of Patent: Apr. 11, 2017

(54) GRAPHICS CARD COOLER

(71) Applicant: Corsair Memory, Inc., Fremont, CA (US)

(72) Inventor: Robert Michael Kinstle, III, Livermore, CA (US)

(73) Assignee: CORSAIR MEMORY, INC., Fremont, CA (US)

( * ) Notice: Subject to any disclaimer, the term of this patent is extended or adjusted under 35 U.S.C. 154(b) by 0 days.

(21) Appl. No.: 14/729,010

(22) Filed: Jun. 2, 2015

(65) Prior Publication Data

US 2015/0346783 A1 Dec. 3, 2015

Related U.S. Application Data

(60) Provisional application No. 62/006,803, filed on Jun. 2, 2014.

(51) Int. Cl.
*G06F 1/20* (2006.01)
*H05K 7/20* (2006.01)
*H05K 1/02* (2006.01)

(52) U.S. Cl.
CPC .......... *H05K 7/20509* (2013.01); *G06F 1/20* (2013.01); *G06F 2200/201* (2013.01); *H05K 1/0203* (2013.01); *H05K 7/20172* (2013.01); *H05K 2201/066* (2013.01)

(58) Field of Classification Search
CPC ........ H05K 7/20; H05K 7/20254; G06F 1/20; H01L 23/427; H01L 23/467; H01L 23/4006; H01L 23/4093; F28D 1/024
USPC ...... 361/679.46–679.54, 688, 689, 690–702, 361/704–712, 715, 719–724; 165/80.2, 165/80.3, 80.4, 80.5, 104.33, 104.34, 165/121–126, 185; 174/15.1, 16.1, 16.3, 174/520; 257/706–712, 718–724; 454/184
See application file for complete search history.

(56) References Cited

U.S. PATENT DOCUMENTS

| 6,671,177 | B1 * | 12/2003 | Han | H01L 23/467 |
| | | | | 165/80.3 |
| 6,982,877 | B2 | 1/2006 | Vinson et al. | |
| 7,321,494 | B2 * | 1/2008 | Han | G06F 1/20 |
| | | | | 165/185 |
| 7,365,989 | B2 * | 4/2008 | Peng | G06F 1/20 |
| | | | | 165/104.33 |
| 7,382,618 | B2 * | 6/2008 | Peng | H01L 23/4093 |
| | | | | 165/104.33 |
| 7,382,621 | B2 * | 6/2008 | Peng | H01L 23/427 |
| | | | | 165/121 |
| 7,443,672 | B2 * | 10/2008 | Peng | H01L 23/4006 |
| | | | | 165/104.33 |
| 7,443,680 | B1 * | 10/2008 | Peng | G06F 1/20 |
| | | | | 165/104.33 |

(Continued)

OTHER PUBLICATIONS

International Application No. PCT/US2015/033853, International Search Report and Written Opinion mailed Aug. 21, 2015.

*Primary Examiner* — Zachary M Pape
*Assistant Examiner* — Amir Jalali
(74) *Attorney, Agent, or Firm* — Corsair Memory, Inc.

(57) ABSTRACT

A bracket for cooling a peripheral component interconnect card is disclosed. The bracket includes a plurality of heat transfer surfaces, mounting systems for a blower fan, fan shroud and liquid cooling system for cooling the peripheral component interconnect card.

10 Claims, 10 Drawing Sheets

(56) References Cited

U.S. PATENT DOCUMENTS

| | | | | |
|---|---|---|---|---|
| 7,447,023 | B2* | 11/2008 | Chen | H01L 23/467 |
| | | | | 165/104.33 |
| 7,529,090 | B2* | 5/2009 | Peng | G06F 1/20 |
| | | | | 165/104.33 |
| 7,551,442 | B2 | 6/2009 | Stefanovski | |
| 7,755,902 | B2* | 7/2010 | Peng | G06F 1/20 |
| | | | | 165/104.33 |
| 7,782,617 | B2* | 8/2010 | Li | G06F 1/20 |
| | | | | 165/104.33 |
| 7,787,247 | B2* | 8/2010 | Han | G06F 1/20 |
| | | | | 165/104.33 |
| 7,885,073 | B2* | 2/2011 | Peng | H01L 23/427 |
| | | | | 165/104.33 |
| 8,159,819 | B2* | 4/2012 | Memon | G06F 1/20 |
| | | | | 165/185 |
| 2005/0158052 | A1 | 7/2005 | Larson | |
| 2008/0080143 | A1* | 4/2008 | Peng | H01L 23/4006 |
| | | | | 361/719 |
| 2009/0147476 | A1* | 6/2009 | Han | G06F 1/20 |
| | | | | 361/697 |
| 2009/0310296 | A1* | 12/2009 | Peng | G06F 1/20 |
| | | | | 361/679.49 |
| 2010/0128431 | A1 | 5/2010 | Eriksen et al. | |
| 2010/0165566 | A1* | 7/2010 | Li | G06F 1/20 |
| | | | | 361/679.47 |
| 2010/0271774 | A1* | 10/2010 | Peng | H01L 23/427 |
| | | | | 361/679.52 |

* cited by examiner

GRAPHICS CARD COOLER

CROSS-REFERENCE TO RELATED APPLICATIONS

The present application claims the benefit of U.S. Provisional Patent Application Ser. No. 62/006,803, filed Jun. 2, 2014 and entitled "Graphics Card Cooler," which is hereby incorporated by reference in its entirety.

TECHNICAL FIELD

The present invention is directed to a bracket for cooling a graphics card or other peripheral component interconnect card.

DETAILED DESCRIPTION OF THE INVENTION

Figure 1:
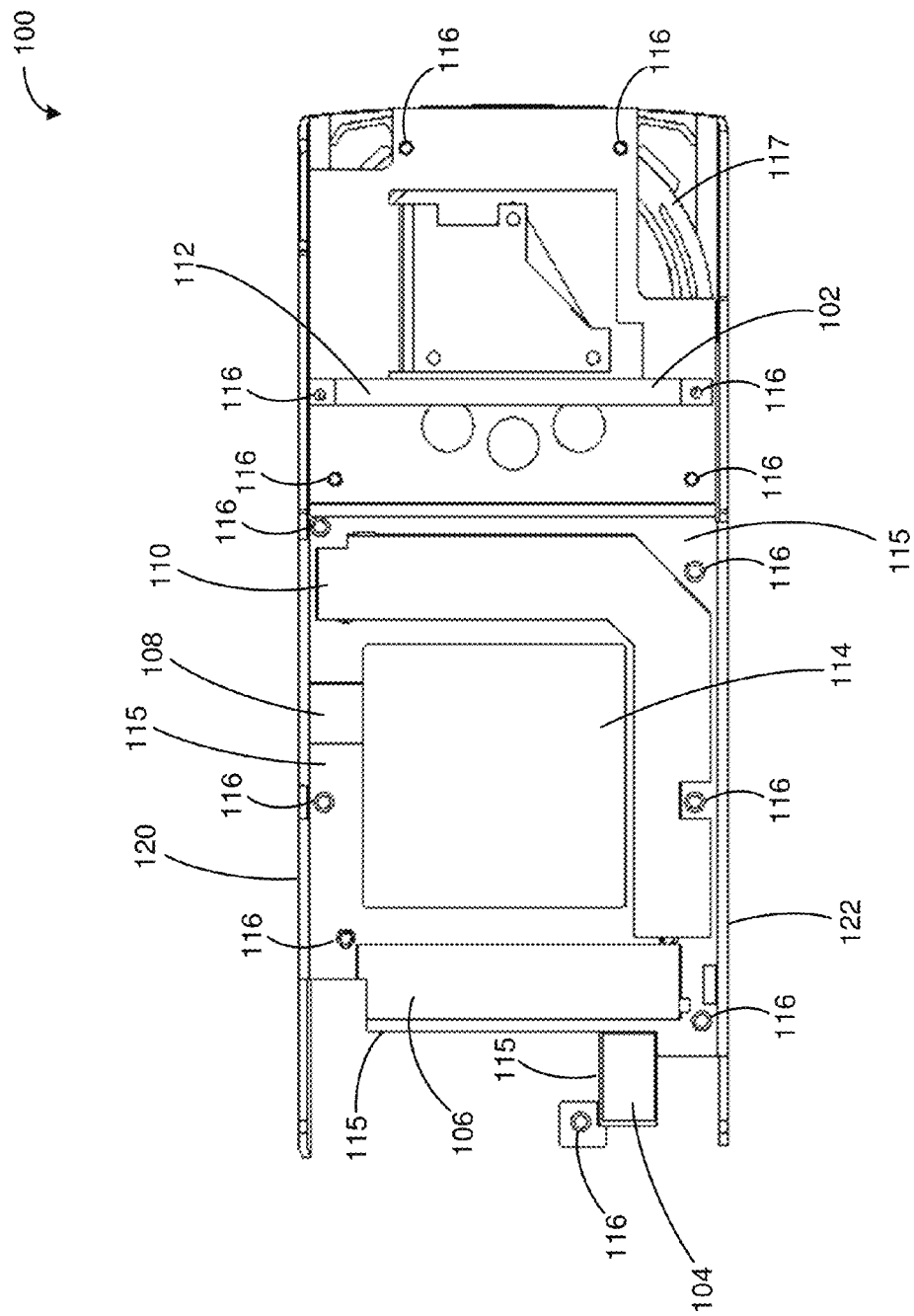
FIG. 1 is a bottom up view of a bracket for cooling a peripheral component interconnect card, according to certain embodiments.

Methods, systems, user interfaces, and other aspects of the invention are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention may be practiced without these particular details. In other instances, methods, procedures, components that are well known to those of ordinary skill in the art are not described in detail to avoid obscuring aspects of the present invention.

Modern graphics cards with graphics processing units (GPUs) draw so much power that current cooling solutions are extremely noisy and unreliable. Furthermore, most high-end GPUs are unable to sustain operation at their maximum rated speeds due to overheating. Larger cooling systems are either not feasible or not practical due to size restrictions of the PCI Express (Peripheral Component Interconnect Express—high speed serial computer expansion bus standard) specification. Existing water cooling solutions are expensive, highly customized, prone to leaks, do not address secondary power sources, and/or violate the PCI Express size limits.

According to certain embodiments, a thick, stamped bracket which makes contact with secondary heat sources (other than the GPU chip itself) via thermal interface material acts as a heat transfer surface and also allows for the mounting of a closed loop liquid cooler designed for PC processors and for mounting to the GPU chip. Non-limiting examples of suitable materials for such a bracket include aluminum or other suitable metal and non-metals that have good heat transfer properties and that are suitable for the mounting of a closed loop liquid cooler designed for PC processor mountings to the GPU chip. Non-limiting examples of non-metals include carbon fiber materials with good thermal conductivity properties. According to certain embodiments, the bracket thickness can range from about 1 mm to about 4 mm, as non-limiting examples. According to certain embodiments, the bracket material can have heat transfer properties in the range of about 50 W/mK to about 400 W/mK (Watts per meter Kelvin). According to certain other embodiments, the bracket material can have heat transfer properties in the range of about 80 W/mK to about 200 W/mK (Watts per meter Kelvin). According to certain embodiments, the bracket is also used for channeling airflow from the fan/blowers such that the airflow is directed over the heat transfer surfaces of the bracket to help remove heat from the GPU chip and secondary heat sources. According to certain embodiments, the bracket is designed to increase surface area for heat transfer. According to certain embodiments, the bracket provides a mounting system for use with blowers (fans) that are used with GPU cards. According to certain embodiments, such blowers utilize the GPU's built in fan speed control. According to certain other embodiments the bracket is cast instead of stamped.

According to certain embodiments, the bracket incudes a mounting system that allows the attachment of closed loop liquid cooling systems commonly available for cooling PC processors, graphics cards, etc. At the same time, such a bracket helps cool the memory and voltage regulator components (herein referred to as secondary heat sources). The bracket has threaded screws and screw holes for mounting to the existing screw holes in the GPU (graphics card), according to certain embodiments. The bracket also has threaded screws and screw holes for attaching a GPU liquid cooler. As non-limiting examples, the bracket can accommodate either AMD or Intel standard mounting patterns, or other standard mounting patterns. According to certain embodiments, non-standard mounting patterns can be used. According to certain embodiments, the bracket can be used for cooling other PCI cards such as FPGA cards (field-programmable gate array), ASIC cards (application-specific integrated circuit) and storage cards. According to certain embodiments, the bracket may include a mount for a fan shroud for directing airflow over the heat transfer surfaces in order to remove heat from the components. According to certain embodiments, the bracket can include mounts for GPU blower fans. The GPU blower fans can be standard GPU blower fans or customized GPU blower fans. The bottom of the bracket has thermal interface material placed to cover significant heat sources. Non-limiting examples of thermal interface materials include thermal pads and thermal grease. This thermal material can be of varying thicknesses to account for variable component heights, for example. As non-limiting examples, thermal pads with a thermal conductivity of about 2 W/mK to about 3 W/mk range (Watts per meter Kelvin) can be applied at the bottom of the bracket to cover one or more of the significant heat sources. As another non-limiting example, thermal pads with a thermal conductivity of about 1 W/mK to about 6 W/mk range can be applied at the bottom of the bracket to cover one or more of the significant heat sources (e.g., secondary heat sources). As a non-limiting example, the thermal interface material/thermal pads are such that they allow for about 20% to about 50% compression range, according to certain embodiments. The top and bottom folds of the bracket serve not only as a surface for branding artwork but also act as additional heat transfer surfaces to further improve heat transfer performance. According to certain embodiments, the top of the bracket stops short of full height to allow for routing of coolant tubes. According to certain embodiments, a heat sink bar (e.g., a bar made of a heat conductive material such as aluminum) is attached to the bottom of the bracket beneath the fan shroud. Such a heat sink bar can help remove heat from voltage regulator modules, for example. According to certain embodiments, the bracket does not have a heat sink bar as in the case when the bottom side of the bracket is on one plane.

FIG. 1 is a bottom up view 100 of a bracket for cooling a peripheral component interconnect card, according to certain embodiments. Non-limiting examples of peripheral component interconnect cards include graphics cards, FPGA cards (field-programmable gate array), ASIC cards (application-specific integrated circuit) and storage cards. In FIG. 1, the bottom up view 100 of the bracket shows an optional heat transfer bar 102 with thermal pad 112 (or alternatively, thermal grease), side walls 120, 122, a plurality of heat transfer surfaces 115, a plurality of thermal pads 104, 106, 108, 110 (or alternatively, thermal grease) on at least some of the heat transfer surfaces, a cut-out 114 for exposing the processing unit chip of the PCI card (e.g., a GPU chip), a plurality of various screw holes 116 and threaded screws 116 for mounting the bracket onto a PCI card (not shown in the figure) and for mounting a liquid cooling system (not shown in the figure) over the processing unit, according to certain embodiments. Some of the screw holes and threaded screws are used for mounting a blower fan and fan shroud 117 onto the bracket when the bracket is installed on PCI card such as graphics card, for example. As previously explained, according to certain embodiments, the bracket can include mounts for blower fans (for example, a GPU blower fan) and a fan shroud. The GPU blower fans can be standard GPU blower fans or customized GPU blower fans.

Figure 2:
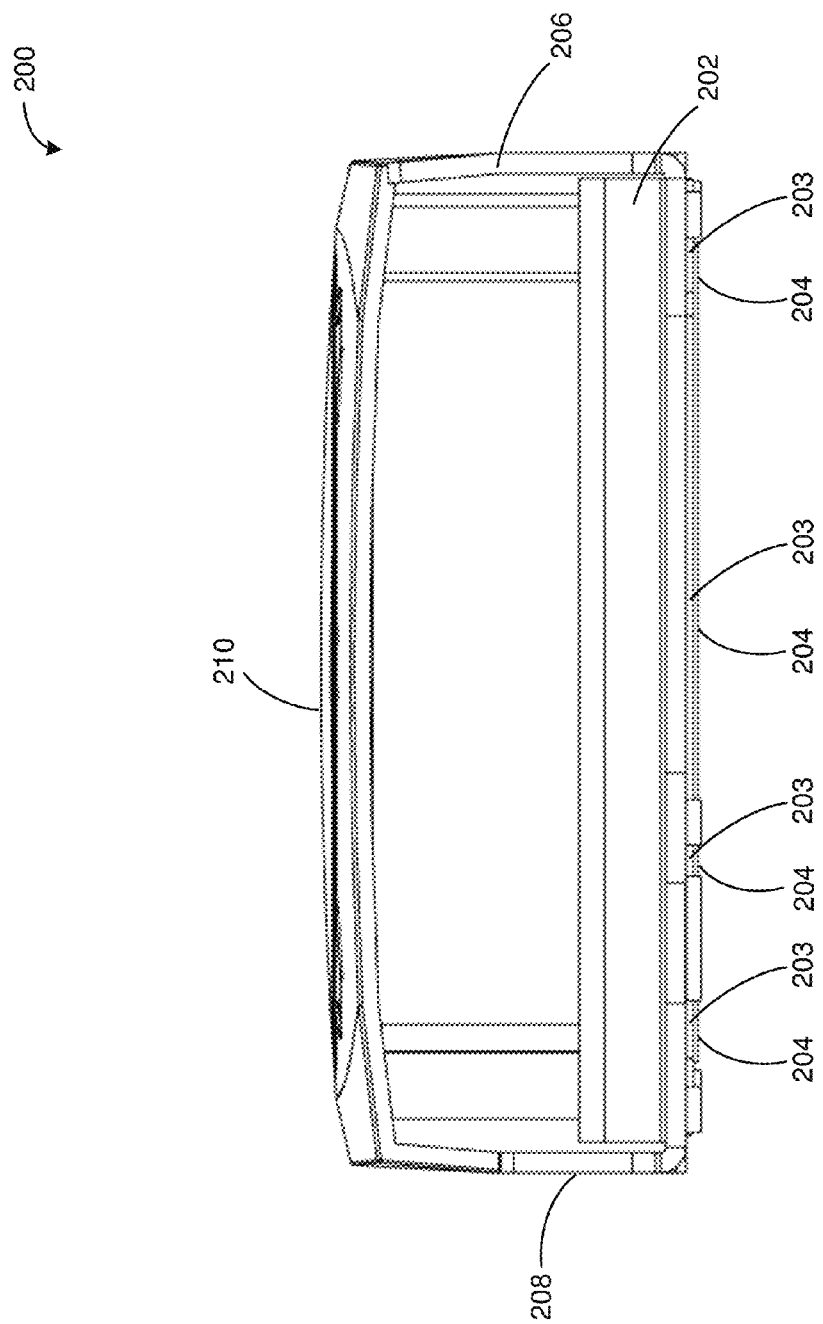
FIG. 2 is a front view of the bracket, with a fan shroud mounted on the bracket, for cooling a peripheral component interconnect card, according to certain embodiments.

FIG. 2 is a front view 200 of the bracket, with a fan shroud mounted on the bracket, for cooling a peripheral component interconnect card, according to certain embodiments. Non-limiting examples of peripheral component interconnect cards include graphics cards, FPGA cards (field-programmable gate array), ASIC cards (application-specific integrated circuit) and storage cards. In FIG. 2, the front view 200 of the bracket shows side walls 206, 208 of the bracket, an optional heat transfer bar 202, a plurality of heat transfer surfaces 203, a plurality of thermal pads 204 (or alternatively, thermal grease) on at least some of the heat transfer surfaces and the optional heat transfer bar, and a fan shroud 210 that can be mounted to the bracket over a blower fan (not shown in the figure), according to certain embodiments.

Figure 3:
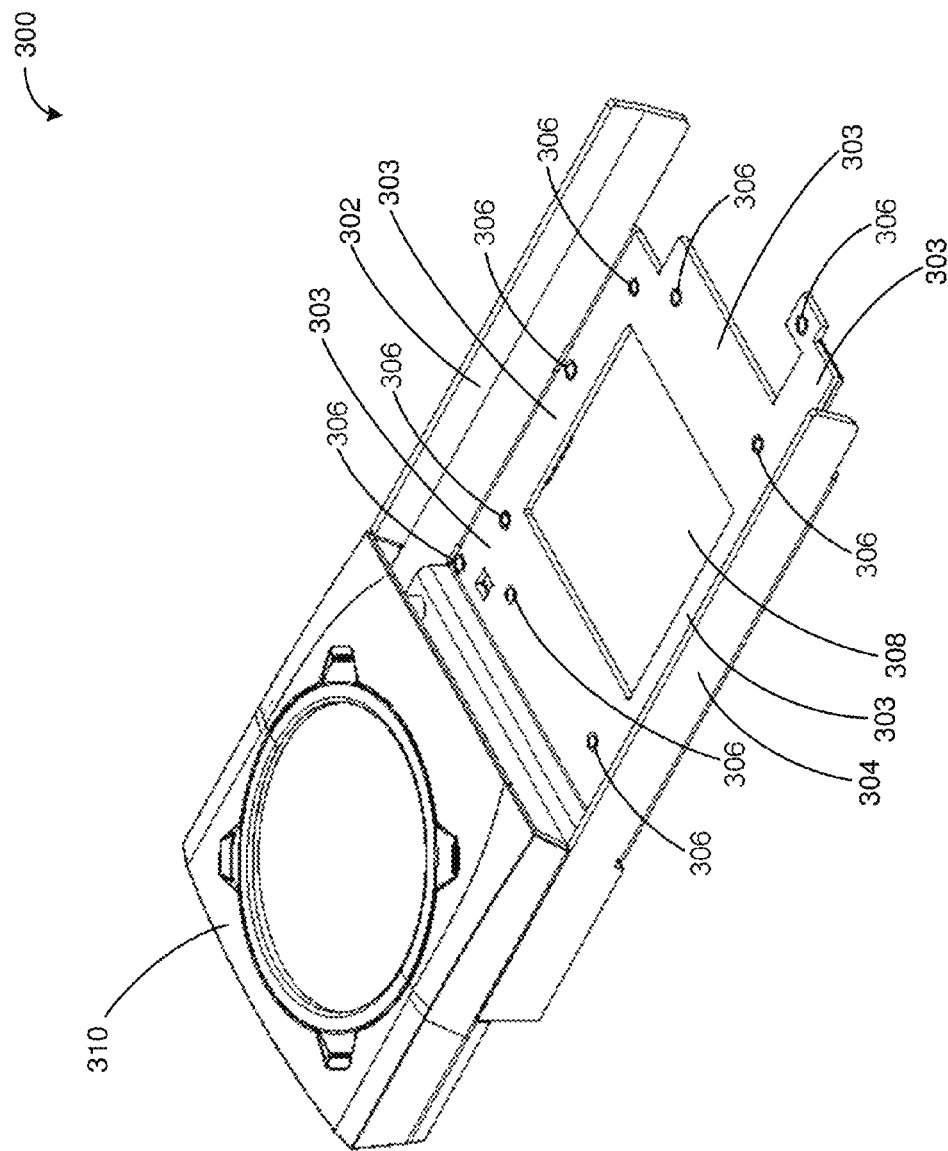
FIG. 3 is a top perspective view of the bracket, with a fan shroud mounted on the bracket, for cooling a peripheral component interconnect card, according to certain embodiments.

FIG. 3 is a top perspective view 300 of the bracket, with a fan shroud mounted on a bracket, for cooling a peripheral component interconnect card, according to certain embodiments. Non-limiting examples of peripheral component interconnect cards include graphics cards, FPGA cards (field-programmable gate array), ASIC cards (application-specific integrated circuit) and storage cards. In FIG. 3, the top perspective view 300 of the bracket shows fan shroud 310, side walls 302, 304, a plurality of heat transfer surfaces 303, a cut-out 308 for exposing the processing unit chip (not shown in the figure) of the PCI card (e.g., a GPU chip), a plurality of various screw holes 306 and threaded screws 306 for mounting the bracket onto a PCI card (not shown in the figure) and for mounting a liquid cooling system (not shown in the figure) over the processing unit, according to certain embodiments.

Figure 4:
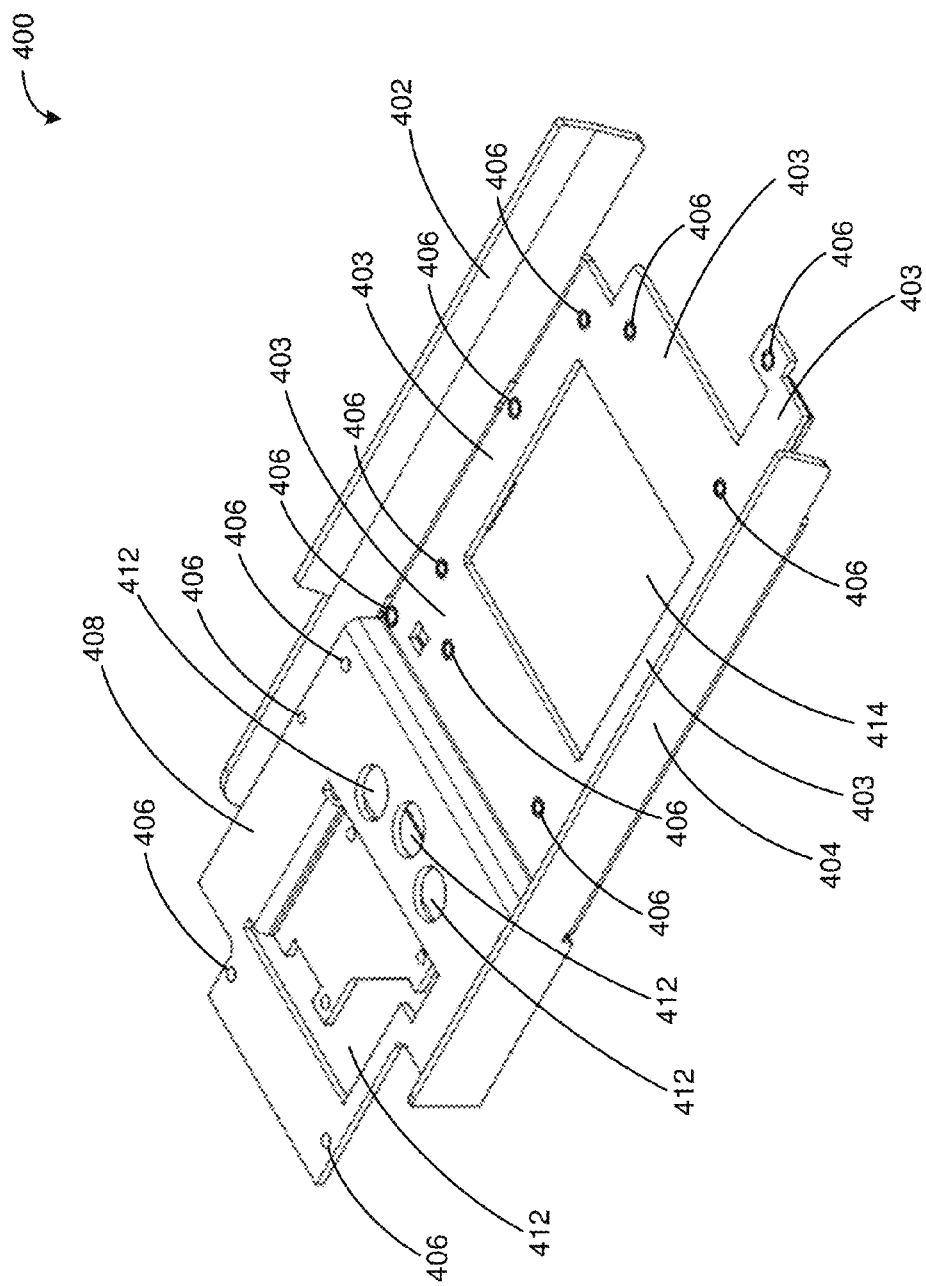
FIG. 4 is a top perspective view of the bracket, without a fan shroud mounted on the bracket, for cooling a peripheral component interconnect card, according to certain embodiments.

FIG. 4 is a top perspective view 400 of the bracket, without a fan shroud mounted on the bracket, for cooling a peripheral component interconnect card, according to certain embodiments. Non-limiting examples of peripheral component interconnect cards include graphics cards, FPGA cards (field-programmable gate array), ASIC cards (application-specific integrated circuit) and storage cards. In FIG. 4, the top perspective view 400 of the bracket (without showing a fan shroud mounted on the bracket) shows side walls 402, 404, a plurality of heat transfer surfaces 403, a cut-out 414 for exposing the processing unit chip (not shown in the figure) of the PCI card (e.g., a GPU chip), a plurality of various screw holes 406 and threaded screws 406 for mounting the bracket onto a PCI card (not shown) and for mounting a liquid cooling system (not shown in the figure) over the processing unit, according to certain embodiments. Some of the screw holes 406 and threaded screws 406 can be used to mount a blower fan (not shown in the figure) and fan shroud (not shown in the figure) over portion 408 of the bracket. Portion 408 includes cut-outs 412.

Figure 5:
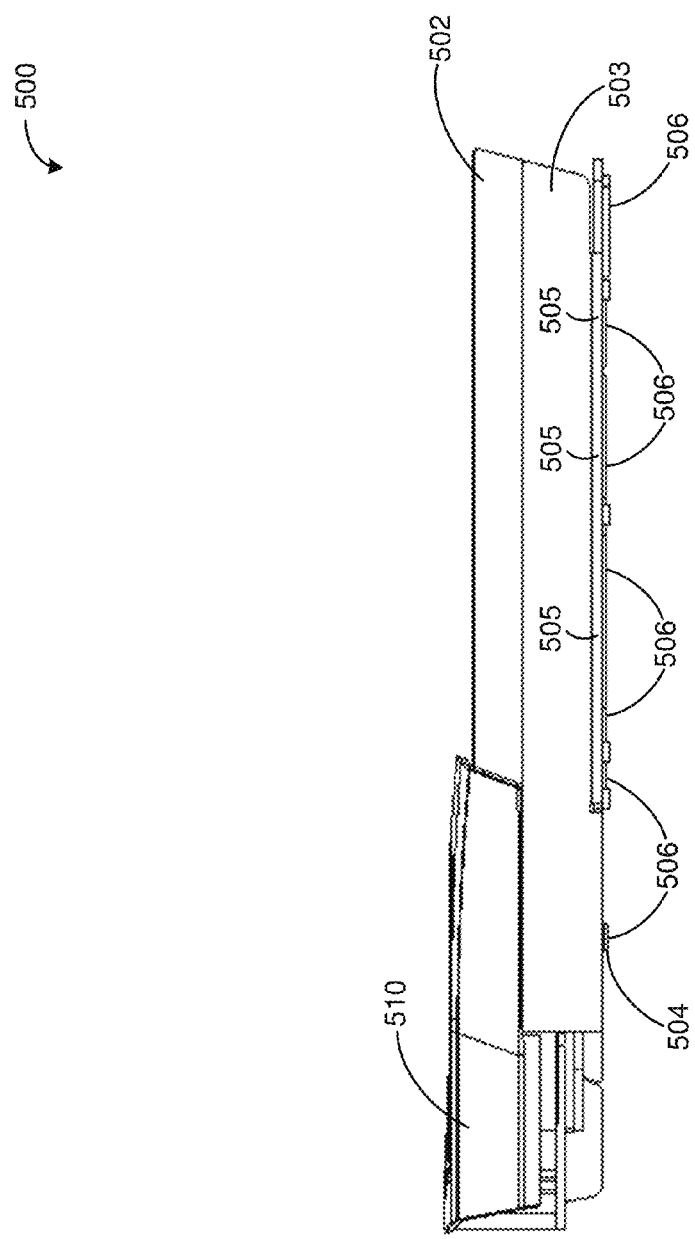
FIG. 5 is a right side view of the bracket, with a fan shroud mounted on the bracket, for cooling a peripheral component interconnect card, according to certain embodiments.

FIG. 5 is a right side view 500 of the bracket, with a fan shroud mounted on the bracket, for cooling a peripheral component interconnect card, according to certain embodiments. Non-limiting examples of peripheral component interconnect cards include graphics cards, FPGA cards (field-programmable gate array), ASIC cards (application-specific integrated circuit) and storage cards. In FIG. 5, the right side view 500 of the bracket shows fan shroud 510, side walls 502, 503, an optional heat transfer bar 504, a plurality of heat transfer surfaces 505, and a plurality of thermal pads 506 (or alternatively, thermal grease) on at least some of the heat transfer surfaces and on the optional heat transfer bar, according to certain embodiments.

Figure 6:
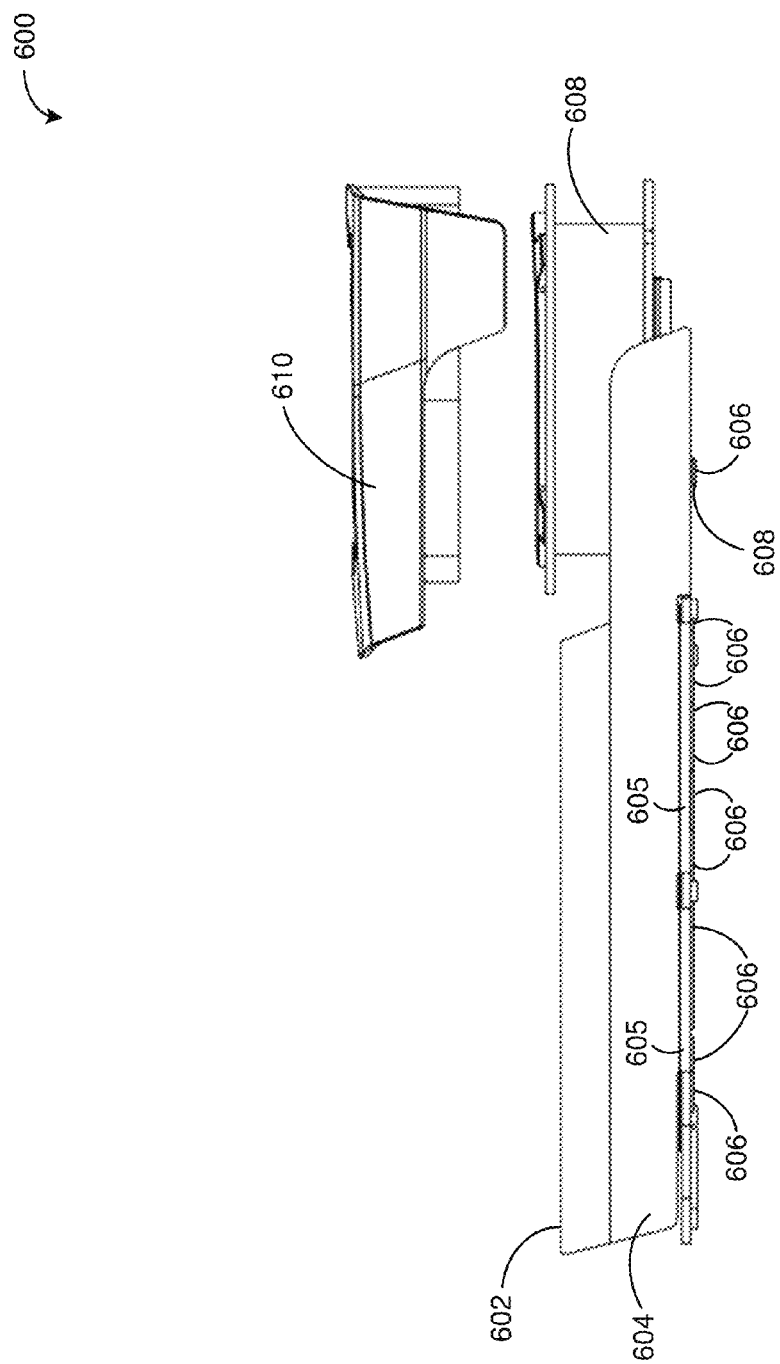
FIG. 6 is a left side view of the bracket, with a fan shroud and a fan blower mounted on the bracket, for cooling a peripheral component interconnect card, according to certain embodiments.

FIG. 6 is a left side view 600 of the bracket, with a fan shroud and a fan blower mounted on the bracket, for cooling a peripheral component interconnect card, according to certain embodiments. Non-limiting examples of peripheral component interconnect cards include graphics cards, FPGA cards (field-programmable gate array), ASIC cards (application-specific integrated circuit) and storage cards. In FIG. 6 the left side view 600 of the bracket shows side walls 602, 604, an optional heat transfer bar 608, a plurality of heat transfer surfaces 605, and a plurality of thermal pads 606 (or alternatively, thermal grease) on at least some of the heat transfer surfaces and on the optional heat transfer bar, according to certain embodiments. FIG. 6 also shows a fan shroud 610 that can be mounted to the bracket over a blower fan 608 according to certain embodiments.

Figure 7:
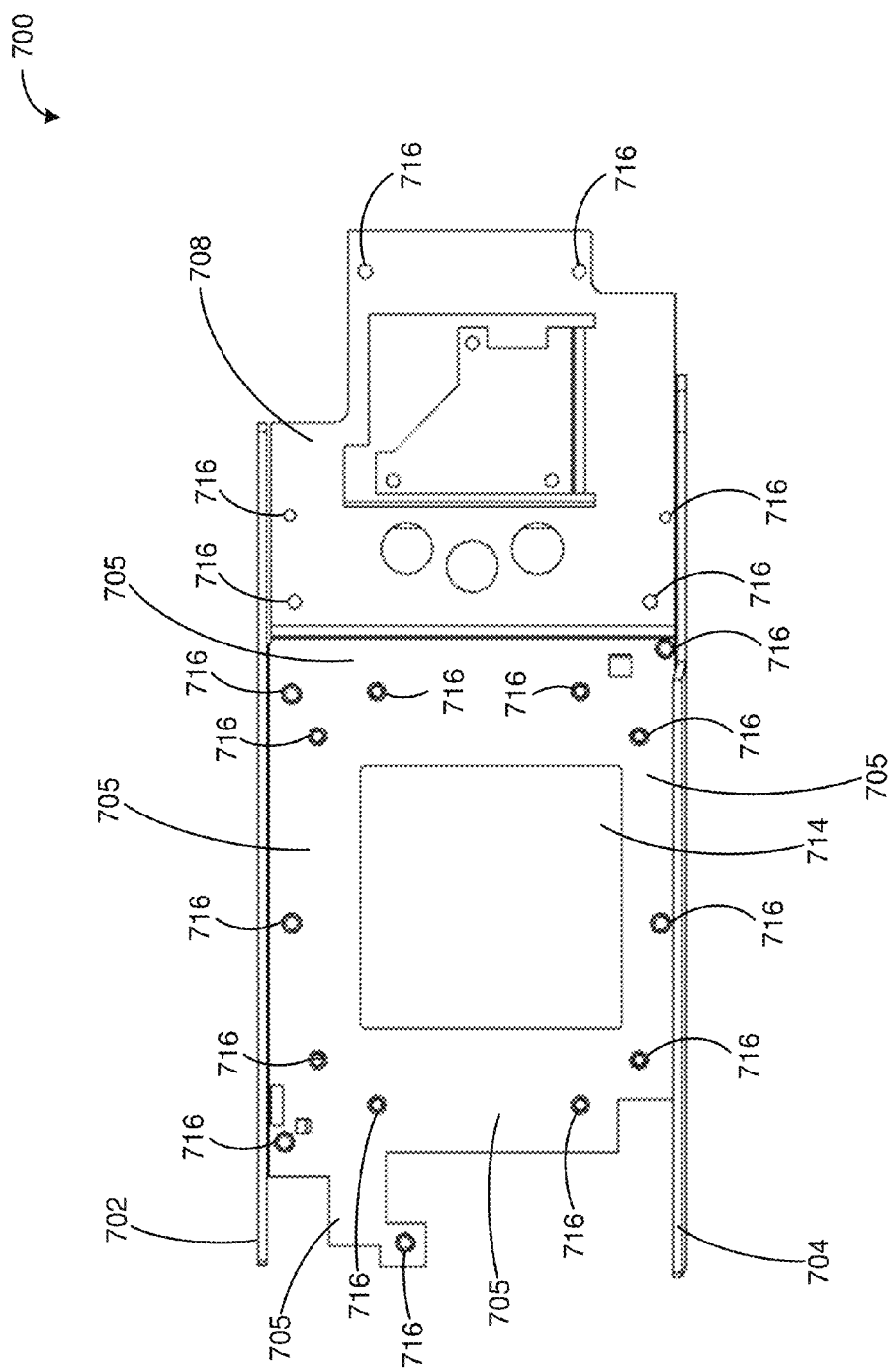
FIG. 7 is a top down view of the bracket, without a fan shroud mounted on the bracket, for cooling a peripheral component interconnect card, according to certain embodiments.
Figure 8:
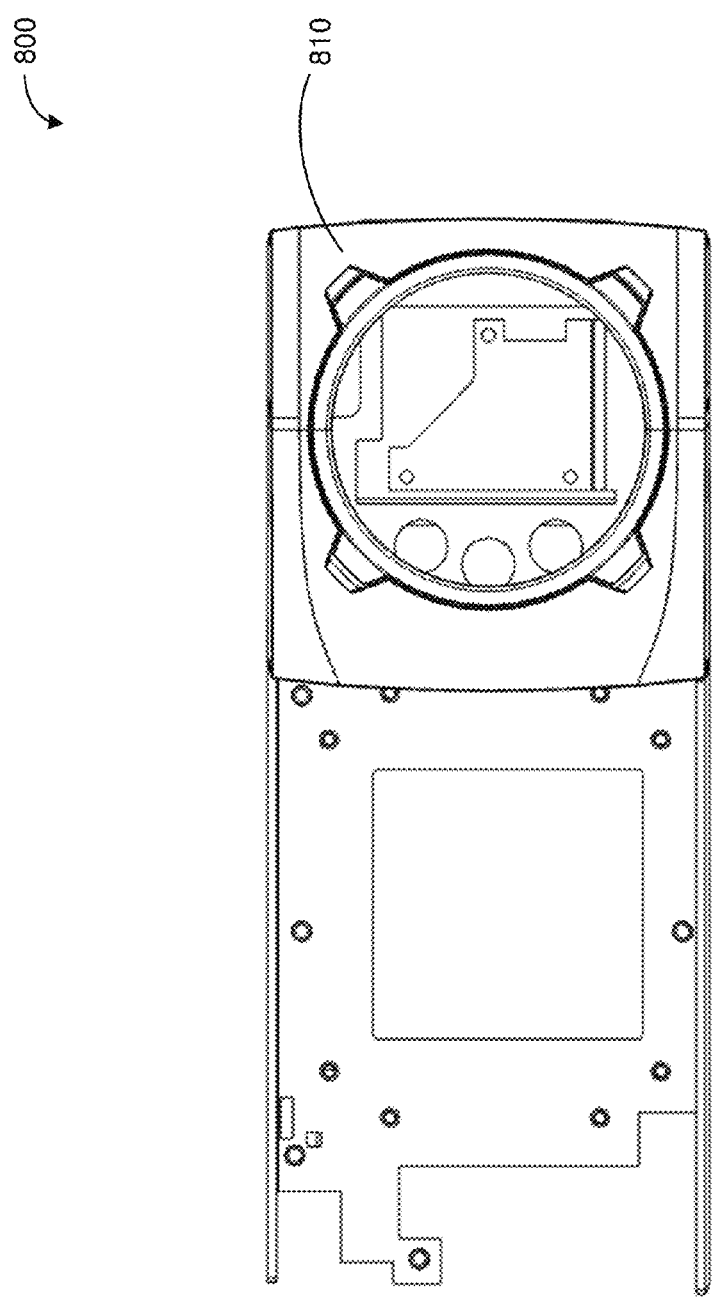
FIG. 8 is a top down view of the bracket, with a fan shroud mounted on the bracket, for cooling a peripheral component interconnect card, according to certain embodiments.

FIG. 7 is a top down view 700 of the bracket, without a fan shroud mounted on the bracket, for cooling a peripheral component interconnect card, according to certain embodiments. Non-limiting examples of peripheral component interconnect cards include graphics cards, FPGA cards (field-programmable gate array), ASIC cards (application-specific integrated circuit) and storage cards. FIG. 7 shows side walls 702, 704, a plurality of heat transfer surfaces 705, a cut-out 714 for exposing the processing unit chip of the PCI card (e.g., a GPU chip), a plurality of various screw holes 716 and threaded screws 716 for mounting the bracket onto a PCI card (not shown in the figure) and for mounting a liquid cooling system (not shown in the figure) over the processing unit, according to certain embodiments. Some of the screw holes and threaded screws area used for mounting a blower fan and fan shroud onto a portion 708 of the bracket when the bracket is installed on PCI card such as graphics card, for example, according to certain embodiments FIG. 8 is a top down view 800 of the bracket, with a fan shroud mounted on the bracket, for cooling a peripheral component interconnect card, according to certain embodiments. Non-limiting examples of peripheral component interconnect cards include graphics cards, FPGA cards (field-programmable gate array), ASIC cards (application-specific integrated circuit) and storage cards. FIG. 8 is similar to FIG. 7 except that FIG. 8 shows a fan shroud 810 mounted on the bracket, according to certain embodiments.

Figure 9:
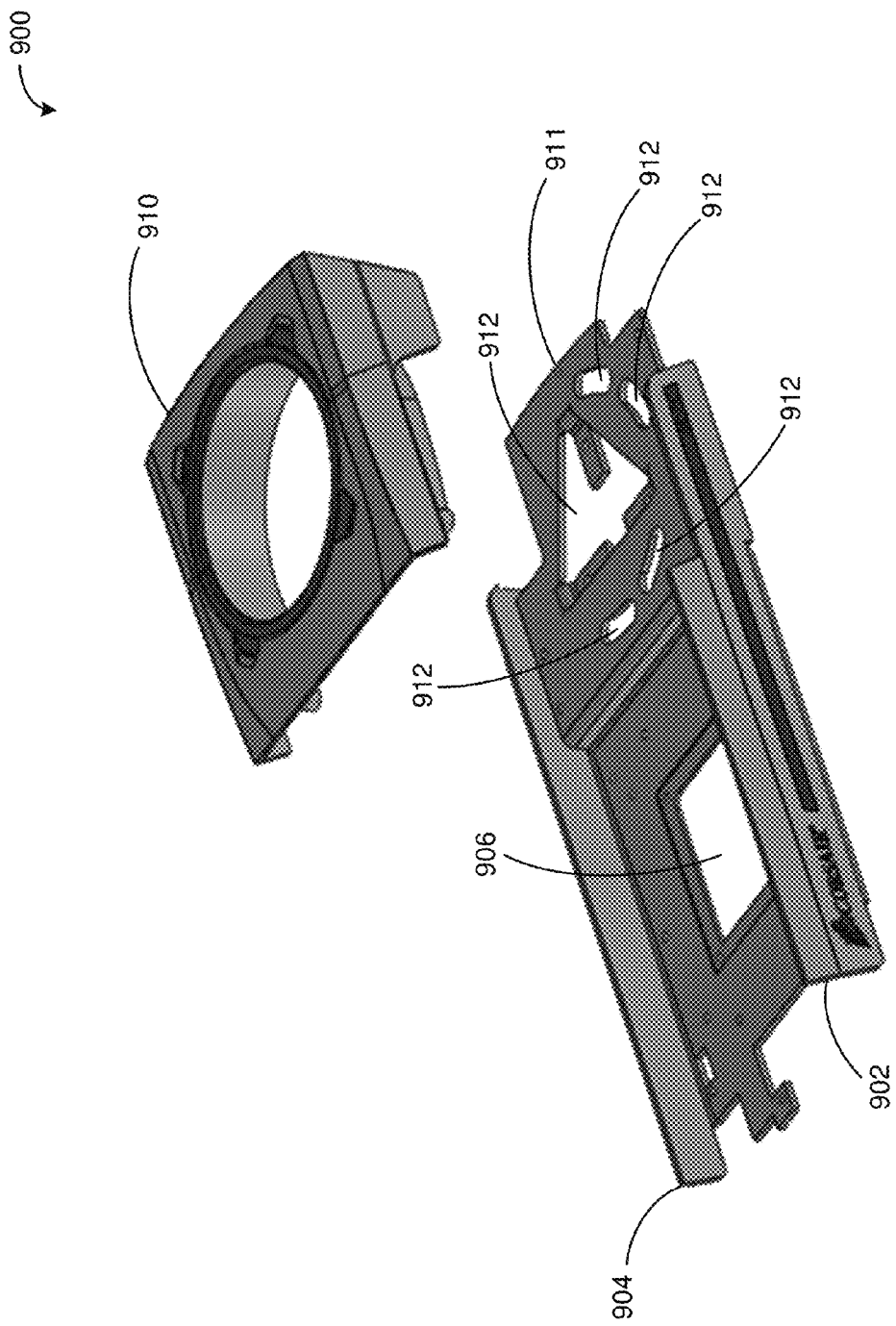
FIG. 9 is a perspective view of another embodiment of a bracket for cooling a peripheral component interconnect card.

FIG. 9 is a perspective view 900 of another embodiment of a bracket for cooling a peripheral component interconnect card. Non-limiting examples of peripheral component interconnect cards include graphics cards, FPGA cards (field-programmable gate array), ASIC cards (application-specific integrated circuit) and storage cards. The bracket in FIG. 9 shows a portion 911 on which a fan shroud 910 can be mounted. Portion 911 of the bracket shows a plurality of cut-outs 912 that differ from the cut-outs 412 as shown in FIG. 4, for example. FIG. 9 also shows a cut-out 906 for exposing the processing unit chip (not shown in the figure) of the PCI card (e.g., a GPU chip), and side walls 902, 904, according to certain embodiments.

Figure 10:
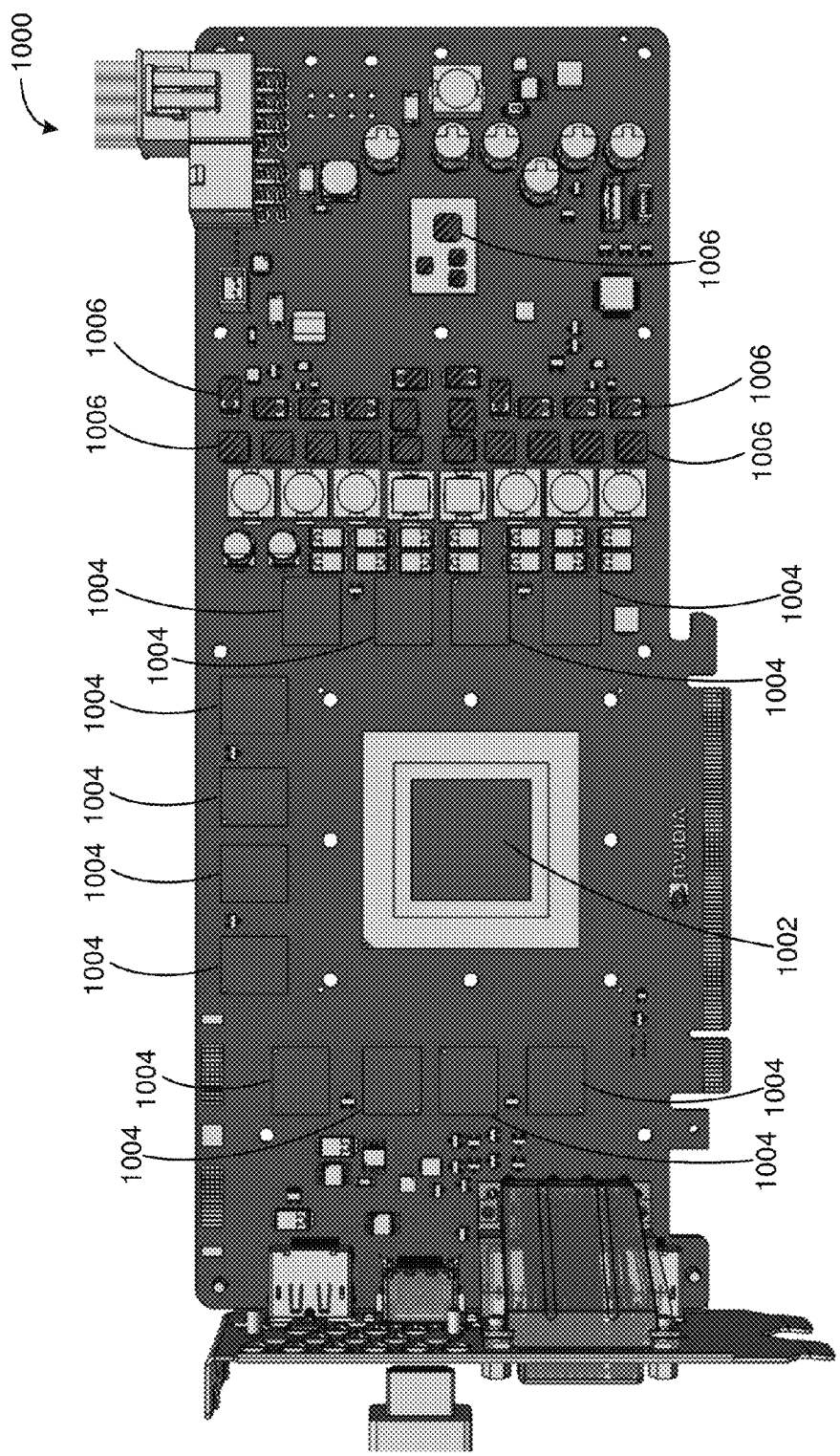
FIG. 10 is a top down view of a sample graphics card, according to certain embodiments.

FIG. 10 is a top down view 1000 of a sample graphics card, which can be cooled by mounting a bracket on it as disclosed herein, the according to certain embodiments. FIG. 10 shows a GPU chip 1002, memory chips 1004, and voltage regulators 1006 (cross hatched). GPU chip 1002, memory chips 1004, and voltage regulators 1006 are sources of heat when the graphics card is in operation. The plurality of heat transfer surfaces of the bracket as described herein can transfer heat away from memory chips 1004, and voltage regulators 1006, for example.

In the foregoing specification, embodiments of the invention have been described with reference to numerous specific details that may vary from implementation to implementation. The specification and drawings are, accordingly, to be regarded in an illustrative rather than a restrictive sense.

I claim:

1. A bracket with heat transfer properties, the bracket comprising:
    a plurality of heat transfer surfaces wherein at least a first part of the plurality of heat transfer surfaces make contact with one or more heat sources on a graphics card when the bracket is mounted on the graphics card, wherein:
    the bracket includes a first set of screw holes for a blower fan to be mounted on the bracket;
    the bracket includes a second set of screw holes for a fan shroud to be mounted on the bracket, wherein the fan shroud directs airflow from the blower fan to flow over a second part of the plurality of heat transfer surfaces to cool the second part of the plurality of heat transfer surfaces when the fan shroud and the blower fan are mounted on the bracket and when the blower fan is turned on;
    the bracket includes a cut-out portion and a third set of screw holes for attachment of a liquid cooling system, wherein the third set of screw holes has a location and sizing that is specific to any one of: an Intel mounting pattern for liquid coolers, and an AMD mounting pattern for liquid coolers, and
    wherein the cut-out portion allows the liquid cooling system to cool a processing unit chip of the graphics card when the bracket is mounted on the graphics card and when the liquid cooling system is mounted over the graphics card; and
    the bracket includes side walls that directs airflow from the fan blower to flow over the plurality of heat transfer surfaces.

2. The bracket of claim 1, wherein one or more of the plurality of heat transfer surfaces has thermal pads applied to the bottom of the one or more of the plurality of heat transfer surfaces.

3. The bracket of claim 1, wherein one or more of the plurality of heat transfer surfaces has thermal grease applied to the one or more of the plurality of heat transfer surfaces.

4. The bracket of claim 1 is a stamped bracket made of material with thermal conductivity in the range of 50 watts per meter Kelvin to 400 watts per meter Kelvin.

5. The bracket of claim 1 is a stamped bracket made of material with thermal conductivity in the range of 80 watts per meter Kelvin to 200 watts per meter Kelvin.

6. The bracket of claim 2, wherein the thermal pads have a thermal conductivity in the range of 1 watt per meter Kelvin to 6 watts per meter Kelvin.

7. The bracket of claim 2, wherein the thermal pads have a thermal conductivity in the range of 2 watts per meter Kelvin to 3 watts per meter Kelvin.

8. The bracket of claim 3, wherein the thermal grease has a thermal conductivity in the range of 1 watt per meter Kelvin to 6 watts per meter Kelvin.

9. The bracket of claim 3, wherein the thermal grease has a thermal conductivity in the range of 2 watts per meter Kelvin to 3 watts per meter Kelvin.

10. The bracket of claim 2, wherein the thermal pads have a compression range between 20% to 50%.

* * * * *